US007996053B2

(12) United States Patent
Walter et al.

(10) Patent No.: US 7,996,053 B2

(45) Date of Patent: Aug. 9, 2011

(54) QUENCH-CONTROLLED HIGH TEMPERATURE SUPERCONDUCTOR

(75) Inventors: Heribert Walter, Erftstadt (DE); Joachim Bock, Erftstadt (DE); Robert Dommerque, Brühl (DE); Sergej Bemert, Köln (DE)

(73) Assignee: Nexans, Paris (FR)

( * ) Notice: Subject to any disclaimer, the term of this patent is extended or adjusted under 35 U.S.C. 154(b) by 901 days.

(21) Appl. No.: 11/891,666

(22) Filed: Aug. 10, 2007

(65) Prior Publication Data

US 2008/0076668 A1 Mar. 27, 2008

(30) Foreign Application Priority Data

Aug. 25, 2006 (DE) ........................ 10 2006 039 807

(51) Int. Cl.

| | |
|---|---|
| ***H01F 6/02*** | (2006.01) |
| ***H02H 9/02*** | (2006.01) |
| ***H01B 12/02*** | (2006.01) |
| ***H01L 39/06*** | (2006.01) |

(52) U.S. Cl. ........ 505/211; 505/220; 505/230; 505/850; 361/19; 338/20; 335/216

(58) Field of Classification Search .................. 505/220, 505/236, 703, 191, 210, 230, 490; 174/125.1; 29/599; 361/19, 93.9; 335/216

See application file for complete search history.

(56) References Cited

U.S. PATENT DOCUMENTS

| | | | | |
|---|---|---|---|---|
| 3,669,905 | A * | 6/1972 | McDougall et al. | 252/512 |
| 4,242,534 | A * | 12/1980 | Marsing | 174/15.5 |
| 5,384,197 | A * | 1/1995 | Koyama et al. | 428/457 |
| 6,584,333 | B1 * | 6/2003 | Gauss et al. | 505/220 |
| 2007/0046408 | A1 * | 3/2007 | Shim | 335/296 |

FOREIGN PATENT DOCUMENTS

| | | | |
|---|---|---|---|
| DE | 10014197 | A1 * | 9/2001 |
| WO | WO0008657 | | 2/2000 |

* cited by examiner

*Primary Examiner* — Stanley Silverman

*Assistant Examiner* — Kallambella Vijayakumar

(74) *Attorney, Agent, or Firm* — Sofer & Haroun, LLP

(57) ABSTRACT

The present invention relates to a quench controlled high temperature superconductor component wherein at least one depression is provided in a surface of the component resulting in a reduced wall thickness, and, wherein an electrical shunt is applied into the depression.

12 Claims, 5 Drawing Sheets

6

QUENCH-CONTROLLED HIGH TEMPERATURE SUPERCONDUCTOR

RELATED APPLICATION

This application claims the benefit of priority from German Patent Application No. 10 2006 039807.6, filed on Aug. 25, 2006, the entirety of which is incorporated herein by reference.

FIELD OF THE INVENTION

The present invention relates to high temperature superconductor (hts) components which are capable to quench in a controlled manner and are protected against local burn-out.

BACKGROUND

High temperature superconductors are characterized by their property to carry current without losses when cooled below a temperature specific to the respective high temperature superconductor material, said temperature being termed critical temperature. Due to this unique property high temperature superconductors can be advantageously used in a broad range of applications, for example, in the production of hts-transformers, windings, magnets, current limiters or electrical leads.

On temperature raise the hts-material undergoes a transition to its normal conducting state, said transition being called "quenching". In its normal conducting state a superconductor material has high ohmic properties. This effect is used in fault current limiters.

The same effect can be achieved if a magnetic field or current applied to a cooled hts-material is enhanced to the respective critical value (critical magnetic field Bc and critical current (Ic), respectively) at which the hts-material also quenches and becomes normal conducting.

These effects or a combination of these effects can be used, for example, for designing a self-controlling fault current limiter based on hts-material. Experiments with high current applied to hts materials, however, have shown that frequently thermo-mechanical problems arise which can lead to destruction of the hts-component.

Hts-materials, usually of ceramic nature, in practical are not perfectly homogenous but show inhomogeneities within the material such as blowholes, blisters and pore, respectively, phases with non-superconducting properties (secondary phases) or small cracks (micro cracks). The geometrical extension of such an inhomogeneity can be from about micrometer to millimeter size.

The regions of such inhomogeneities differ with respect of the superconducting properties such as critical temperature, critical current and critical magnetic field from defect-free regions.

Consequently, in case of current flow through a cooled high temperature superconductor regions with material inhomogeneities can locally change to the normal conducting state. The locally increasing resistance in these regions results in an excessive increase of the current flow in the surrounding superconducting areas of the hts-material. Said local current increase is associated with the generation of heat.

In turn, the heated areas start to quench due to the temperature increase. This process is self-triggering and proceeds avalanching and finally results in crack formation in the hts-material due to thermo-mechanical stress. At the final stage an electric arc can ignite at the cracks (about 10 000 K), which results in destruction of the whole area around the heated region (hot-spot) due to local melting.

The whole process is extra-ordinarily brief and takes place within about sixty msec only.

For avoiding formation of such hot-spots it is known to provide the hts-component with an electrical by-pass termed shunt. Such by-pass can be a layer of an electrical conducting metal such as Ag applied onto the surface of the hts-component. In case of overcurrent, when the hts material or part thereof starts to quench and becomes resistive excessive current is bypassed to the shunt and in the result hot-spot formation is avoided.

However, for example in bulk hts components, such as rods or tubes, for providing an effective protection of the overall hts component from hot-spot formation the bypass must cover the whole surface of the hts component, and surrounds the whole perimeter. Otherwise, in regions not covered by the bypass the risk of hot-spot formation remains.

On the other side, if the whole perimeter is covered by the shunt circular currents can be induced in the shunt material. Such induced currents are undesired since they, in turn, generate a magnetic field and heat which can impair the performance of the hts components and the application, respectively, of which the hts component is part.

In addition to bulk hts components thin-film superconductor components are known.

Typically, thin-film superconductors are wires or tapes composed of a substrate onto which a thin layer of superconductor material is applied. Similar to bulk structures for by-passing excessive current the hts layer can be covered with a shunt.

EP 1 383 178 relates to such thin-film superconductor fault current limiter designed to quench in a controlled way without formation of hot-spots in case of fault event.

Along the length of the tape regions with decreased width are provided, so-called constrictions, which are separated by regions of original width of the tape. By suitable selection of the length and cross-section of the superconductor layer at the constriction on one side and at the regions therebetween simultaneous quench of the constrictions is achieved during the initial period of a fault event thereby avoiding concentration of dissipated power in one region only. Further, by varying the thickness of the by-pass layer of both the constrictions and the regions therebetween resistance can be adjusted to alloy the constrictions to become dissipative already at the initial period whereas the regions therebetween become normal conducting at longer times only. Here, the shunt layer covers the hts layer over its whole width.

Similarly, JP 5022855 suggests to provide a plurality of regions with reduced cross-section along the extension of a superconductor in a regular manner. In case of fault current, these regions with reduced cross-section quench simultaneously already at the initial period of the fault event thereby limiting the excess current. During the course of the fault heat generated in said regions with reduced cross-section is expanded to the region therebetween and promotes uniform quenching of these regions. No shunt is disclosed at all.

Also DE 100 14 197 relates to thin-film superconductor fault current limiters and to the promotion of uniform quenching. Again, over the whole surface of the superconductor layer artificial weak points are distributed. These weak points can be generated by reduction of the layer thickness or by reduction of the critical current density by, for example, doping with impurities. For by-passing excessive current and for promoting expansion of heat generated the whole surface of the tape is covered by a shunt material.

In none of these documents the problems associated with a shunt covering the whole surface of a bulk hts component is addressed.

Objects and Summary:

It was the object of the present invention to avoid uncontrolled hot-spot formation and local burnout of a bulk superconductor component at areas with in homogeneities.

In particular, it was the object of the present invention to provide a bulk hts component suitable for a plurality of applications which is protected against hot-spot formation without the need of covering the whole surface of the hts component with a shunt.

The object of the present invention is solved by a high temperature superconductor component which is provided with at least one region of reduced wall thickness, wherein within that at least one region of reduced wall thickness an electrical shunt is provided.

Said regions of reduced wall thickness, typically, are depressions within the surface of the high temperature superconductor component. The depressions, preferably, have a linear shape extending at least partially over the surface of the hts component.

The present invention is particularly useful for bulk high temperature superconductors of ceramic nature. Such bulk ceramics can, for example, be obtained by compression, for example isostatic compression, or by a melt casting process.

The bulk component can be massive with the cross section through the high temperature superconductor component being entirely filled with high temperature superconductor material. The high temperature superconductor component may, however, also be hollow, that is to say a cross section through the component has a free surface enclosed by high temperature superconductor material. In the scope of the present invention, both massive and hollow high temperature superconductor components may be used, which in a preferred embodiment may be designed as tubes or as rods. Examples for suitable high temperature superconductor components are found, for example, in WO 00/08657, to which reference is expressly made here.

For the present invention any ceramic oxide high temperature superconductor may be used. Preferably, the ceramic oxide high temperature superconductor is selected from the group consisting of bismuth-based, thallium-based, yttrium-based, and mercury-based ceramic oxide superconductors. Typical examples comprise ceramic oxide high temperature superconductors based on Bi-Ae-Cu—O, (Bi, Pb)-Ae-Cu—O, (Y, Re)-Ae-Cu—O or (Tl, Pb)-Ae, Y)—Cu—O or Hg-Ae-Cu—O. In the above formulas Ae means at least one alkaline earth element, particularly, Ba, Ca and/or Sr.

Re means at least one rare earth element, particularly Y or a combination of two or more of the element Y, La, Lu, Sc, Se, Nd or Yw.

Particularly, suitable ceramic oxide high temperature superconductors are those known by the reference BSCCO-2212, BSCCO-2223, wherein the numerical combinations 2212 and 2223 stand for the stoichiometric ratios of the elements Bi, Sr, Ca and Cu, in particular those, wherein part of Bi is substituted by Pb; and those known by the reference YBCO-123 and YBCO-211, wherein the numerical combinations 123 and 211 stand for the stoichiometric ratios of the elements Y, Ba and Cu.

BRIEF DESCRIPTION OF THE DRAWINGS

In the following the present invention is illustrated in more detail with the reference to the accompanying figures.

It is shown in

DETAILED DESCRIPTION

Figure 1:
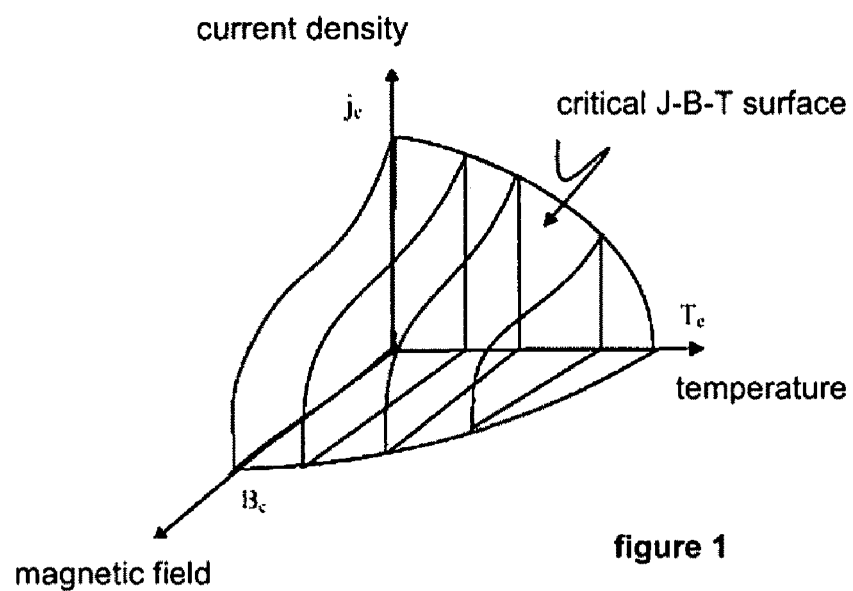
FIG. 1 a surface plot within a phase diagram with T, B and J axis.

The diagram shown in FIG. 1 illustrates the inter-dependency of current density, temperature and magnetic field on the superconducting state of a superconductor material. If at least one of critical current Ic, critical temperature Tc, and magnetic field Bc is exceeded the superconductor material becomes resistive and turns to it normal conducting state.

The "critical J-B-T surface" represents the outer boundary outside of which the material is not in a superconducting state. Consequently, the volume enclosed by the critical J-B-T surface represents the superconducting region for the superconducting material.

Figure 2:
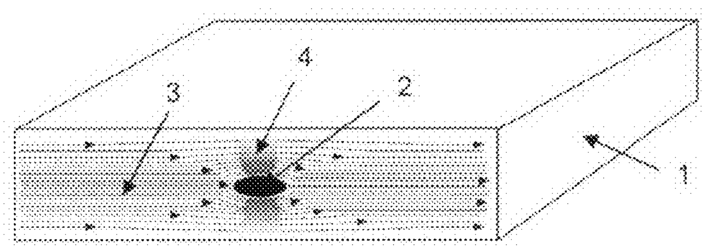
FIG. 2 to 4 schematically the course of the formation of a hot-spot within a plate-shaped high temperature superconductor, FIGS. 5 and 6 schematically a plate-shaped high temperature superconductor with pre-determined weak point.
Figure 3:
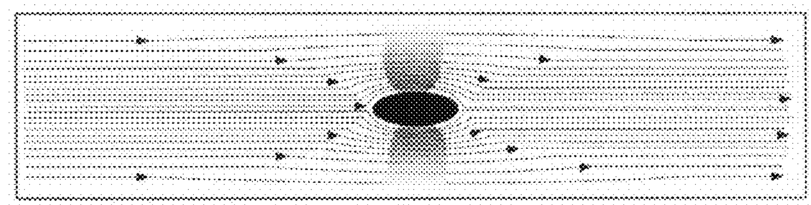
Figure 4:
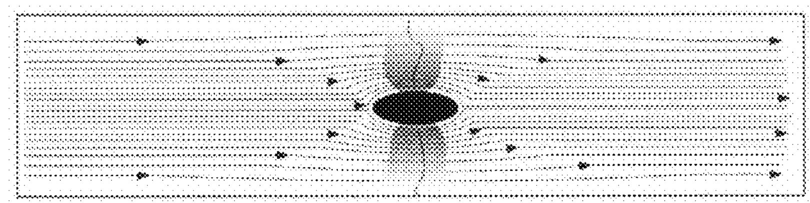

In FIGS. 2 to 4 schematically the course of the generation of a hot-spot resulting in burnout is shown.

FIG. 2 shows a plate shaped high temperature superconductor 1 with an area of inhomogeneity 2 (or hot-spot) with the current flow and distribution of current being indicated schematically by streamlines 3 and the direction of current flow being indicated by arrows. As can be seen in FIG. 2 or, in particular in FIG. 3 being a vertical section through the plate according to FIG. 2, in the region 4 below and above of the inhomogeneity 2 the density of the streamlines 3 is increased resulting in an increasing heating of said regions 4. In the figures said areas of increasing heating 4 are indicated as shaded areas above and below the inhomogeneity 2. In FIG. 4 the advanced heating has already caused crack formation.

In FIGS. 5 to 8 the principle of the present invention for avoiding such damage of material in areas with inhomogeneites is schematically illustrated.

Figure 5:
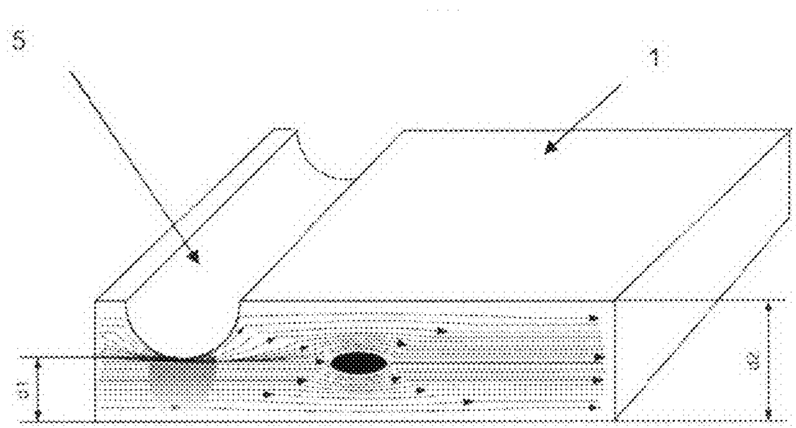
Figure 6:
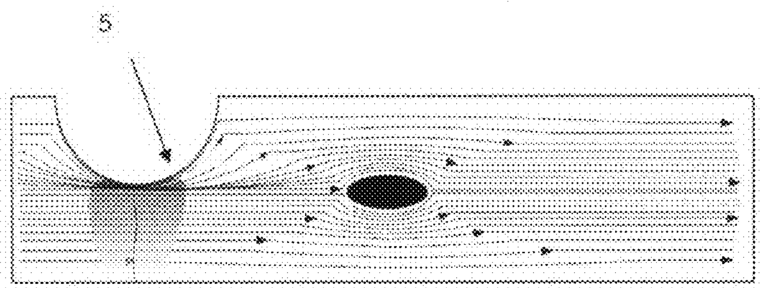

As shown in FIG. 5 the plate shaped high temperature superconductor component 1 is locally thinned by decreasing the wall thickness. For reducing the wall thickness depressions are provided into the surface of the material, which can be in the form of stripes or lines or similar.

The significantly reduced wall thickness d1 in the region d1 results in a corresponding increase of the density of the streamlines 3 below the depression. Consequently, in case of overcurrent the high temperature superconductor component will start to quench in this region with reduced wall thickness. Compared to the reduced wall thickness d1 any inhomogeneity within the region with wall thickness d2 is no longer effective for initial quenching, that is hot-spot formation.

In case of overcurrent, for example due to mains short circuit, the region with reduced wall thickness will heat-up, such region of reduced wall thickness, thus, forming a predetermined weak point within the hts component.

Figure 7:
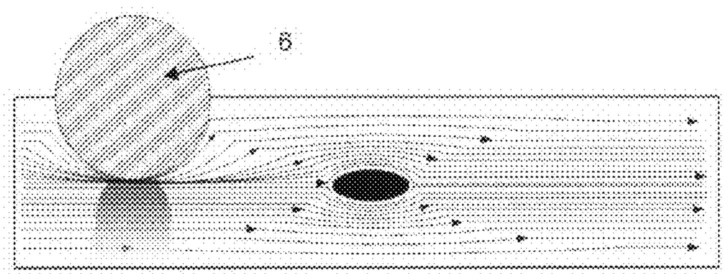
FIG. 7 schematically a plate-shaped high temperature superconductor according to the present invention.

For avoiding excessive heating up until crack formation and, finally, possible destruction of the material, according to the present invention preferably a shunt is provided as electrical by-pass. For example, a shunt of a sufficiently resistive material can be provided within the depressions as a bypass as shown in FIG. 7. In the embodiment shown the shunt is designed as a wire.

Figure 8:
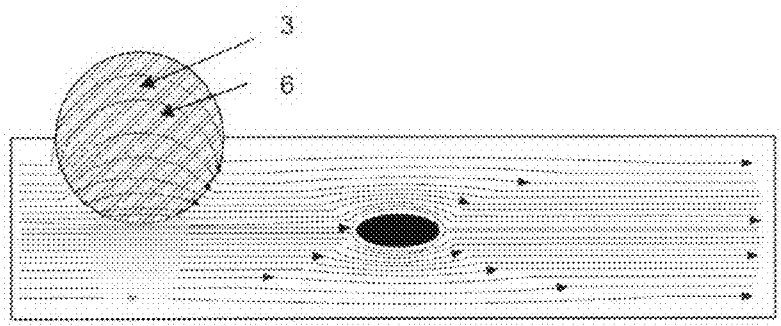
FIG. 8 schematically the distribution of the current density in the high temperature superconductor component according to FIG. 7.

In the following the operating mode of the present invention is illustrated with reference to FIGS. 7 and 8.

As indicated in FIG. 7, at comparatively low current the density of the streamlines is increased below the shunt material which results in heating in this region. On further heating, that is with decrease of the superconducting cross section, the current commutates into the shunt material and the high temperature superconductor material is protected against further heat increase and, in the consequence, against any damage (FIG. 8).

The same is valid in case of increased current flow.

In principle, the present invention can be applied to a bulk superconductor component of any shape and is not restricted to a specific geometry.

Figure 9:
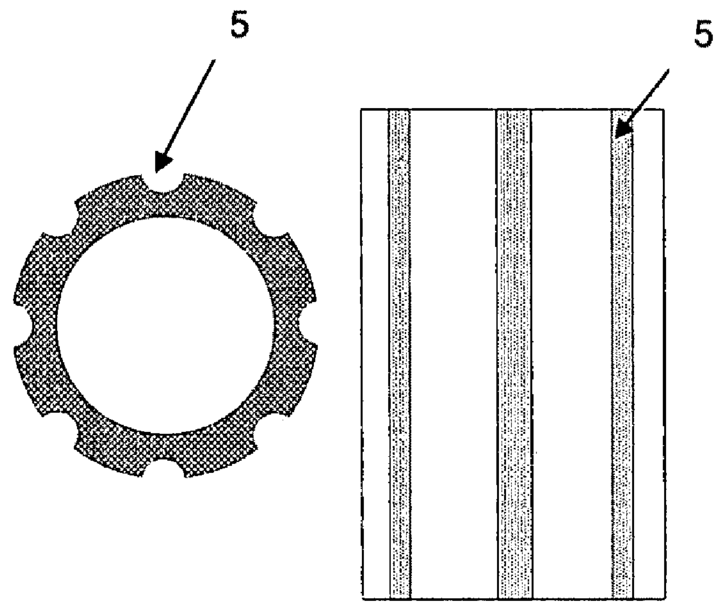
FIGS. 9 and 10 schematically further embodiments of the present invention.
Figure 10:
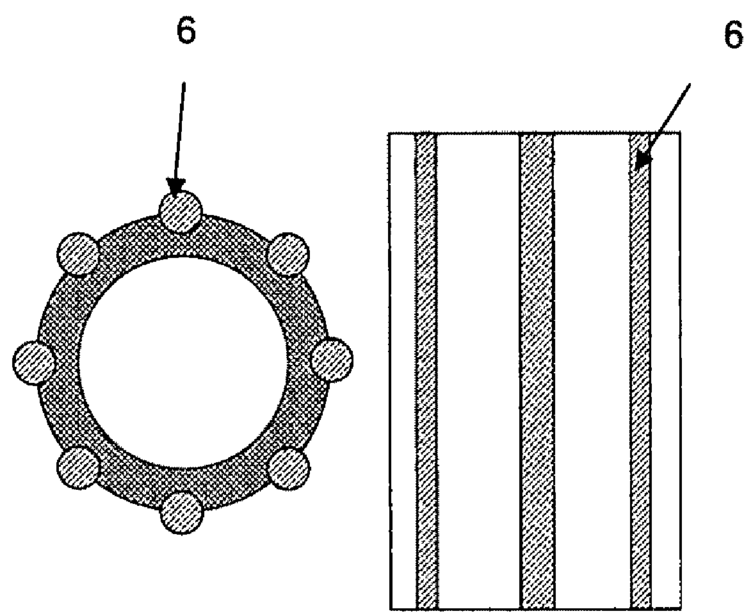

For illustration purpose reference is made to FIGS. 9 and 10 wherein the superconductor component is a tube.

In the outer surface of the tube a plurality of linear depressions 5 are provided around the perimeter of the tube. Here, the lines extend along the longitudinal axis of the tube from one end of the tube to the opposite end.

The shunt material is filled within the depressions 5 and, preferably, is fixed thereto by soldering as, for example, referred to below.

For the present invention, in principle, any material suitable as a shunt for by-passing excessive current in superconductor components can be used for the electrical shunt of the present invention. A suitable material for the electrical shunt has a resistivity which is sufficiently high with respect to the hts material in case of normal operation, that is, when the hts material is superconducting, so that the current does not commutate to the shunt. On the other side, in case of overcurrent, when the hts material turns resistive the resistivity of the shunt material must be sufficiently low, so that the current is by-passed to the shunt.

Examples for suitable materials are copper-nickel-alloys, for example copper-nickel 10, copper-nickel 20 and copper-30 as well as copper-nickel-manganese-alloys, for example LV-7 with 20% nickel and 20% manganese, with the balance being copper, as well as further metals.

The shunt can have any geometrical cross section. Examples are tapes with more or less rectangular cross section, wires with round or oval cross section, trapezoid cross section etc.

In order to ensure good contact of the surface of the depression with the outer surface of the shunt the geometrical conditions should be adapted to each other.

Good electrical contact between the shunt and the high temperature superconductor material can be achieved, for example, by a suitable soldering method. To this, in a first step a metallized surface is produced within the region of reduced thickness. Metallization of the surface can be achieved by coating with a suitable metal, for example, silver, within said region, for example, by spraying, brushing, dipping or similar. In order to obtain low contact resistance within said region subsequent to metallizing the metal is burned into the high temperature material by a thermal process.

For example, in case of BSCCO-2212 burning can be carried out by about 850° C. As is clear, the specific conditions for the burning step such as temperature can vary depending to the material, selection of suitable conditions however can be done by normal routine.

There is no restriction with respect to the orientation of the shunt relative to the direction of current flow, as indicated by the streamlines 3, through the hts material. For example, referring to the tube shown in FIGS. 9 and 10, if the direction of the current flow is parallel to the longitudinal axis of the tube the pass way of the shunt can be any, for example parallel, vertical or have any inclination towards to the streamlines. As to the position and passway of the shunt the same is valid in case that the current flow is in radial direction through the hts-tube.

The number and extent of depressions can be selected according to need. Preferably, the depressions are distributed over the whole surface of the hts component at a distance which is sufficient to avoid undesired hot-spot formation within a region not covered by a shunt.

For determining the extent of reduction of cross section (i.e. the depth of the depression) it must be born in mind that the area of reduced cross section functions as pre-determined weak point. Consequently, the extent of reduction of cross section is selected to compensate the inhomogeneities present in the individual component and has to be determined individually for any component taking into consideration the inhomogeneity of the material.

For example, in the embodiment referred to herein the cross section was reduced by about 25 to 30%.

In determining the distribution and area covered by the shunt the extent of heating of the shunt material must be considered caused by the commutating current.

That is, the distribution and area covered must be sufficient to control the heating, in particular to avoid melting of the shunt material and/or the solder.

Considering the criteria referred to above selection of sufficient reduction of cross section as well as of distribution and area covered by the shunt can be easily carried out for any individual component.

Figure 11:
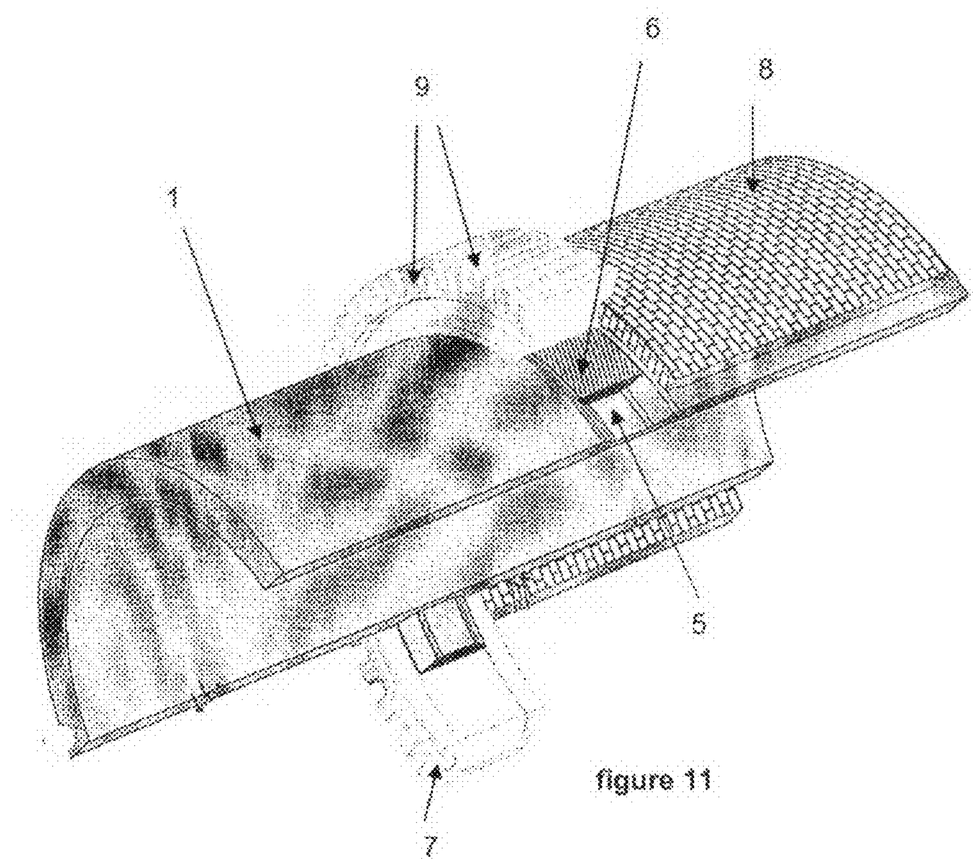
FIG. 11 a yet further embodiment of the present invention.

A further embodiment of the present invention is shown in FIG. 11.

According to this embodiment in addition to the electrical shunt 6 referred to above, a further shunt 7 can be provided which is connected to the electrical shunt 6. This further shunt 7 is made of a material of good thermal conductivity (referred to "thermal shunt"). By the provision of such additional thermal shunt 6 heat removal is promoted.

Examples for materials with thermal conductivity which are suitable as thermal shunt are copper, aluminum or any other material with similar heat conductivity.

As shown in FIG. 11 a hts-component 1, here a tube made of BSCCO-2212, is provided with a depression 5 around its whole perimeter. The depression 5 is filled with the electrical shunt 6 onto which a thermal shunt 6 is provided.

Since the longitudinal extension of the annular shunt 6 is only small compared to the overall length of the tube 1 the influence of possibly induced circular currents is negligible.

Further shown is a reinforcing means 8, provided around the outer surface of the tube-shaped hts component 1 for mechanical stabilization of the hts component. Such reinforcing means and materials therefore are generally known in the art. For example, as in the embodiment of FIG. 11, the reinforcing means 8 can be a reinforcing tube made, for example, of glass reinforced carbon.

As shown in FIG. 11 the surface of the thermal shunt 7 can have an enhanced surface area for better heat removal. For example, for enhancing the surface area rips or similar can be provided.

The present invention relates to a hts component protected against undesired hot-spot formation by commutating the streamlines of the current flow into an electrical by-pass wherein the extent of commutation is controlled by the gradient of the wall-thickness of the hts component.

The high temperature superconductor component of the present invention can be suitably used in a broad range of applications such as in the production of hts transformers, windings, magnets, current limiters or electrical leads.

The invention claimed is:

1. High temperature superconductor component, the high temperature superconductor component being a bulk component, wherein on the surface of the high temperature superconductor component is provided at least one region with reduced wall thickness for forming a predetermined weak point and wherein an electrical shunt is provided in the region with reduced wall thickness.

2. High temperature superconductor component according to claim 1, wherein the at least one region with reduced wall thickness is a depression in the surface of the high temperature superconductor component.

3. High temperature superconductor component according to claim 1, wherein a plurality of depressions are distributed over the whole surface of the high temperature superconductor component.

4. High temperature superconductor component according to claim 2, wherein the at least one depression has a linear, round, oval or corvered extension.

5. High temperature superconductor component according to claim 1, wherein the electrical shunt is covered with a thermal shunt.

6. High temperature superconductor component according to claim 5, wherein on the surface of the thermal shunt, means for enhancing the surface area are provided.

7. High temperature superconductor temperature according to claim 6, wherein the means for enhancing the surface area of the thermal shunt are rips.

8. High temperature superconductor component according to claim 1, wherein the high temperature superconductor component is a tube or rod.

9. High temperature superconductor component, according to claim 1, wherein the component is obtainable by compression or by a melt-casting process.

10. High temperature superconductor component, according to claim 2, wherein the at least one depression extends along the perimeter of the high temperature superconductor component.

11. A method for making a electrical component, said method comprising the steps of:

obtaining any one of temperature superconductor transformers, winding, magnets, current limiters or electrical leads; and forming at least one high temperature superconductor component within said temperature superconductor transformers, winding, magnets, current limiters or electrical leads, using said high temperature component according to claim 1.

12. High-temperature superconductor component according to claim 1, wherein the high-temperature superconductor component is a bulk component selected from:

a component being massive with the cross-section through the high-temperature superconductor component being entirely filled with high-temperature superconductor material, and a hollow component wherein the cross-section through the component has a free surface enclosed by high-temperature superconductor material.

* * * * *